United States Patent
Hierlemann et al.

(10) Patent No.: US 7,586,158 B2
(45) Date of Patent: Sep. 8, 2009

(54) PIEZOELECTRIC STRESS LINER FOR BULK AND SOI

(75) Inventors: Matthias Hierlemann, Fishkill, NY (US); Jingyu Lian, Hopewell Junction, NY (US); Rudolf Stierstorfer, Beacon, NY (US)

(73) Assignee: Infineon Technologies AG, Munich (DE)

( * ) Notice: Subject to any disclaimer, the term of this patent is extended or adjusted under 35 U.S.C. 154(b) by 372 days.

(21) Appl. No.: 11/176,727

(22) Filed: Jul. 7, 2005

(65) Prior Publication Data

US 2007/0018328 A1 Jan. 25, 2007

(51) Int. Cl.
*H01L 29/76* (2006.01)
(52) U.S. Cl. .............. 257/369; 257/510; 257/E27.006
(58) Field of Classification Search ............... 257/369, 257/351, 510, 520, 410, 632, E27.006; 438/430
See application file for complete search history.

(56) References Cited

U.S. PATENT DOCUMENTS

| | | | |
|---|---|---|---|
| 3,585,415 A | 6/1971 | Muller et al. | |
| 5,341,012 A * | 8/1994 | Misawa et al. | 257/351 |
| 5,763,315 A | 6/1998 | Benedict et al. | |
| 5,998,910 A | 12/1999 | Park et al. | |
| 6,087,241 A | 7/2000 | St. Amand et al. | |
| 6,090,661 A | 7/2000 | Perng et al. | |
| 6,118,148 A * | 9/2000 | Yamazaki | 257/327 |
| 6,211,064 B1 | 4/2001 | Lee | |
| 6,406,973 B1 | 6/2002 | Lee | |
| 6,429,091 B1 | 8/2002 | Chen et al. | |
| 6,555,879 B1 * | 4/2003 | Krivokapic et al. | 257/382 |
| 6,573,172 B1 | 6/2003 | En et al. | |
| 6,583,488 B1 | 6/2003 | Xiang | |
| 6,642,124 B1 | 11/2003 | Yamauchi | |
| 6,767,749 B2 | 7/2004 | Kub et al. | |
| 6,882,025 B2 | 4/2005 | Yeo et al. | |
| 7,084,061 B2 * | 8/2006 | Sun et al. | 438/685 |
| 2003/0173641 A1 | 9/2003 | Ohta et al. | |
| 2004/0121553 A1 | 6/2004 | Tamura | |
| 2004/0238914 A1 | 12/2004 | Deshpande et al. | |
| 2004/0262784 A1 | 12/2004 | Doris et al. | |
| 2005/0020022 A1 | 1/2005 | Grudowski | |
| 2005/0072352 A1 | 4/2005 | Eissler | |

FOREIGN PATENT DOCUMENTS

| | | |
|---|---|---|
| JP | 03046261 A | 2/1991 |
| JP | 03132072 A | 6/1991 |
| WO | WO 2004/010485 A2 | 1/2004 |
| WO | WO 2004/049406 A1 | 6/2004 |

* cited by examiner

*Primary Examiner*—Mark Prenty
(74) *Attorney, Agent, or Firm*—Slater & Matsil, L.L.P.

(57) ABSTRACT

A preferred embodiment of the invention provides a semiconductor device. A preferred device comprises an n-channel transistor and a p-channel transistor disposed in a semiconductor body and a piezoelectric layer overlying the n-channel transistor and the p-channel transistor. In a preferred embodiment of the invention, the piezoelectric layer is biased to a first potential at a portion near the n-channel transistor and is biased to a second potential as a portion near the p-channel transistor.

36 Claims, 10 Drawing Sheets

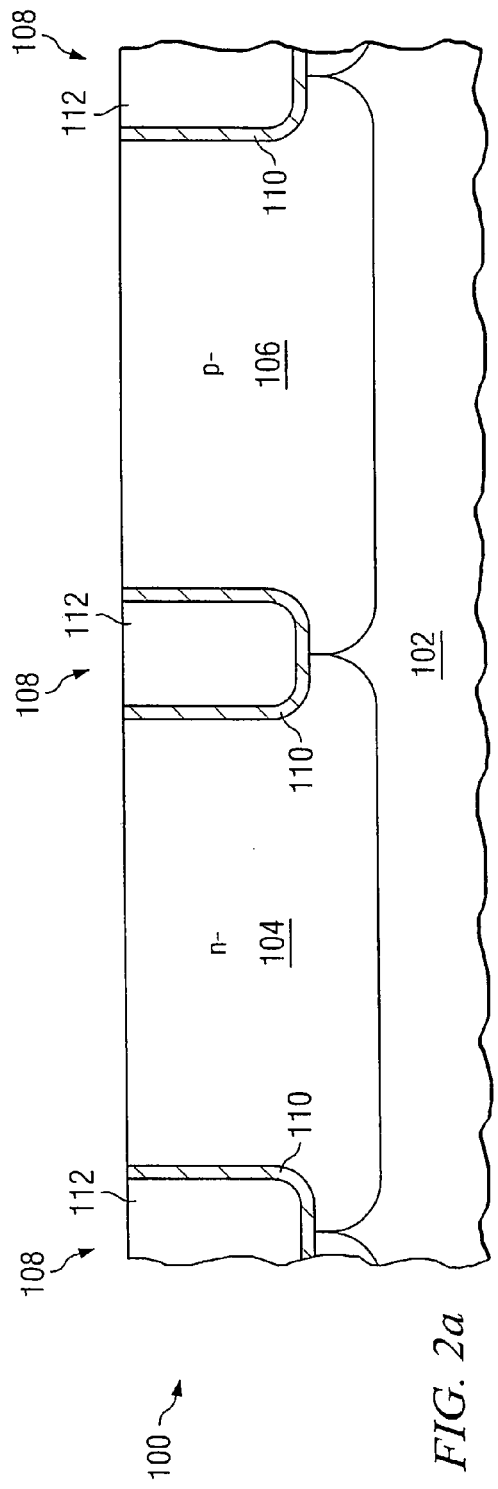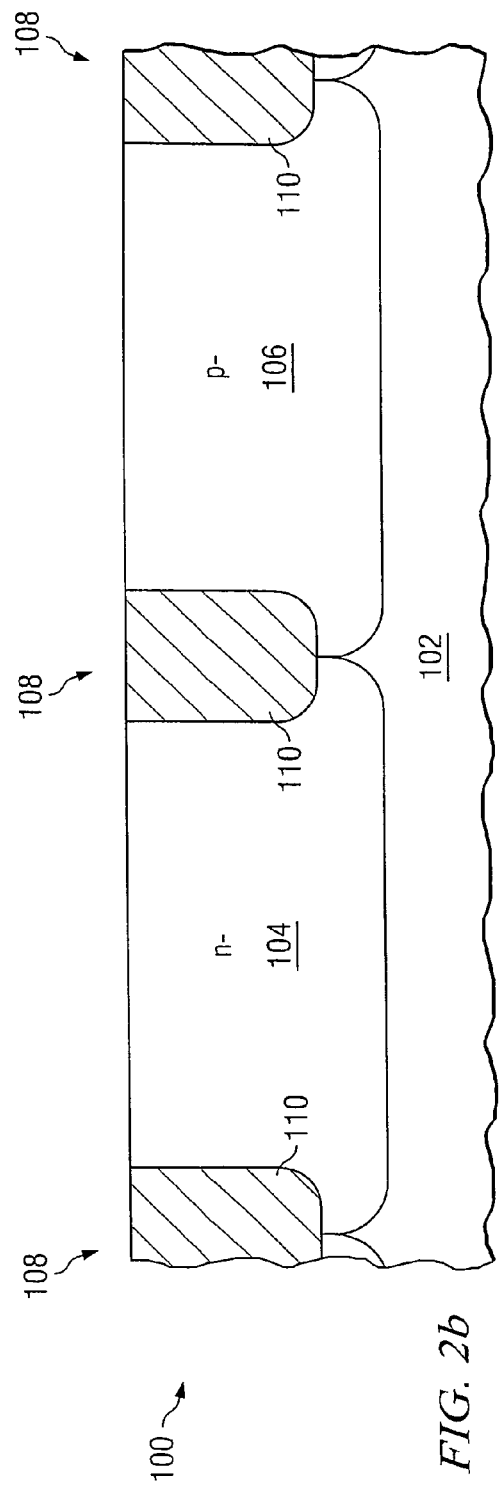
FIG. 2a
FIG. 2b

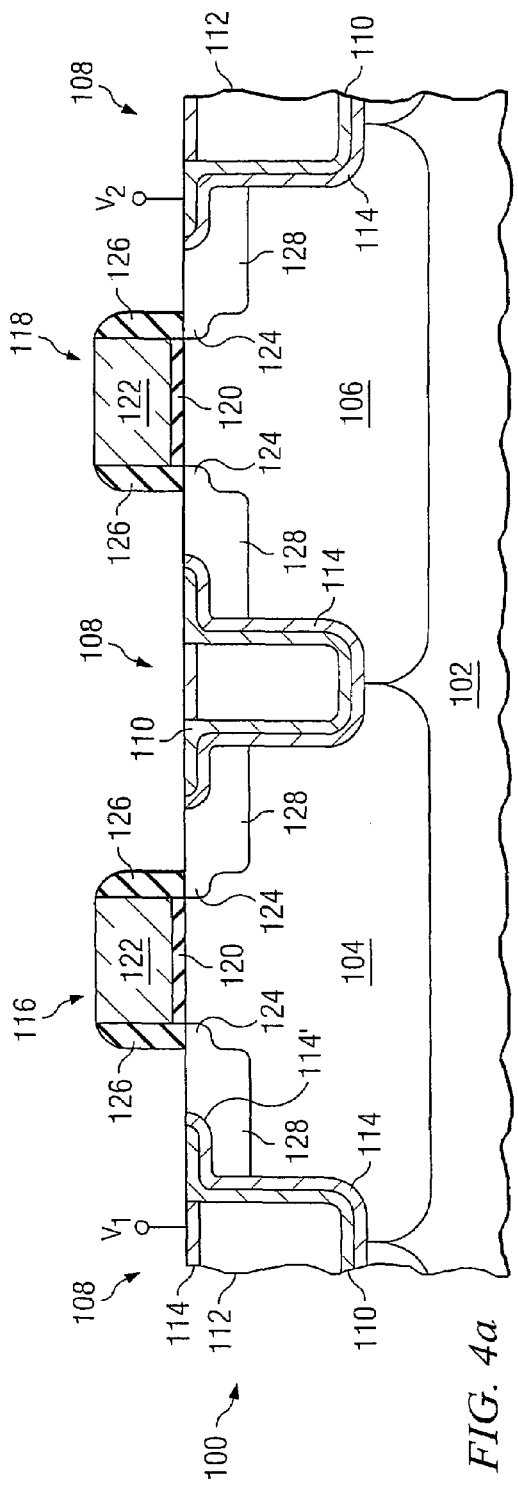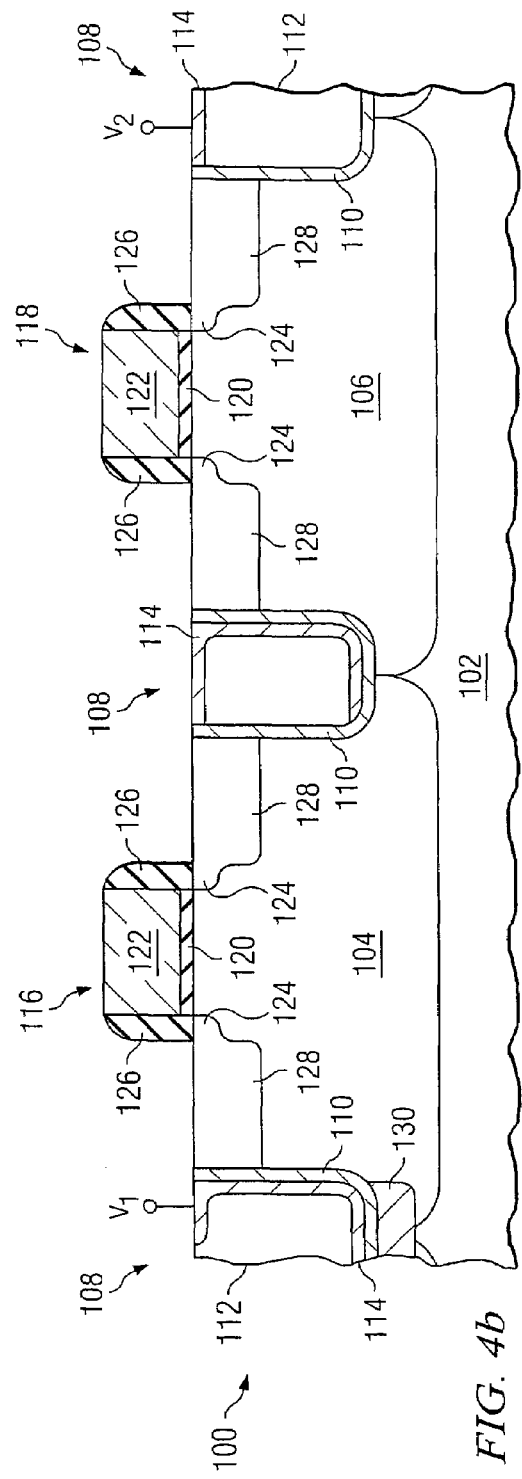
FIG. 4a
FIG. 4b

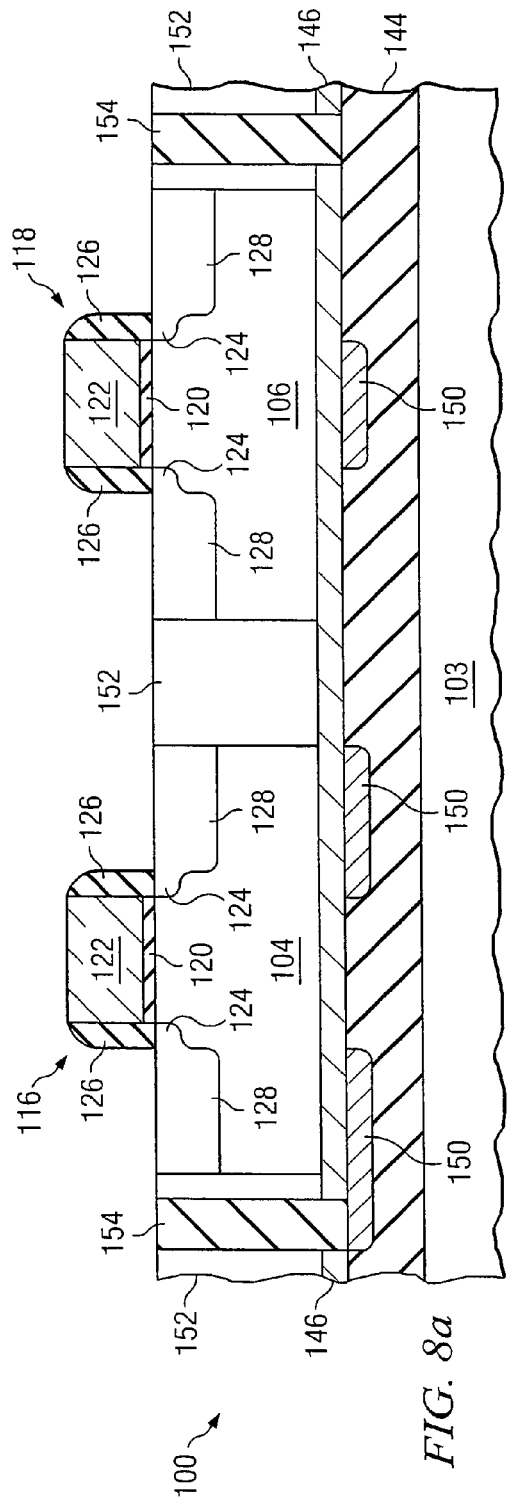
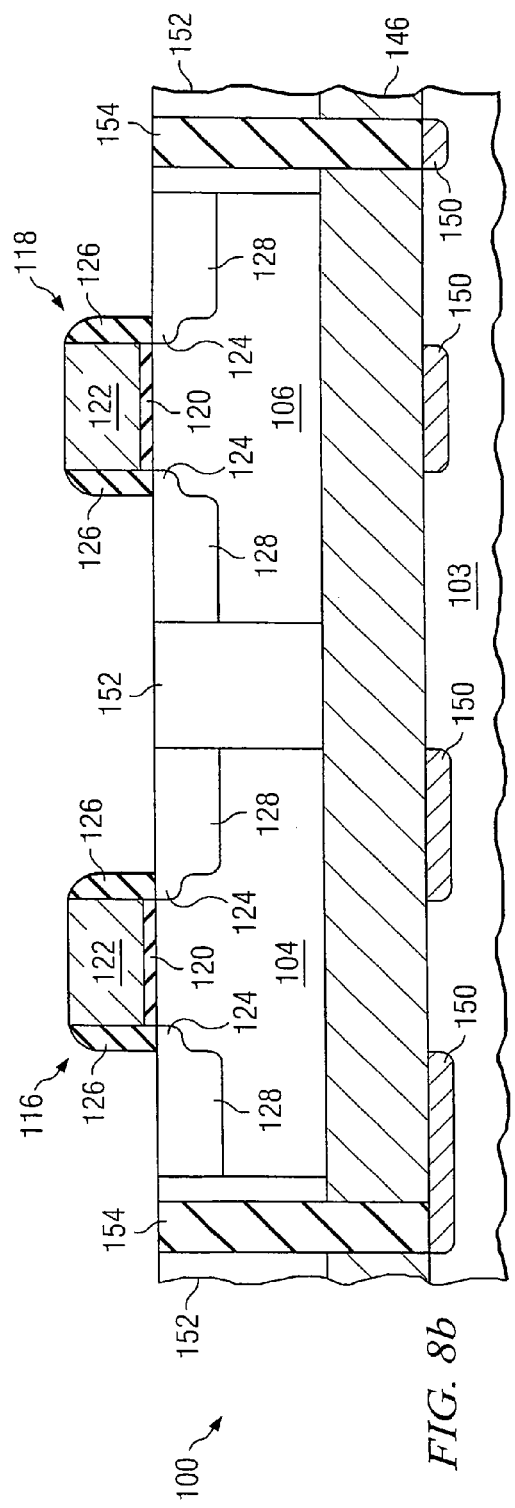
FIG. 8a
FIG. 8b

PIEZOELECTRIC STRESS LINER FOR BULK AND SOI

TECHNICAL FIELD

This invention relates generally to semiconductor devices and methods, and more particularly to devices and methods for modulating stress in transistors in order to improve performance.

BACKGROUND

Semiconductor devices are used in a large number of electronic devices such as computers, cell phones and others. One of the goals of the semiconductor industry is to continue shrinking the size and increasing the speed of individual devices. Smaller devices can operate at higher speeds since the physical distance between components is smaller. In addition, higher conductivity materials such as copper are replacing lower conductivity materials such as aluminum. One other challenge is to increase the mobility of semiconductor carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility and performance boost of devices. For example, stress can be provided by a contact etch stop layer (CESL), single layers, dual layers, stress memory transfer layers, and STI liners. Most of these techniques use nitride layers to provide tensile and compressive stresses, however other materials can be used in other applications, e.g., HDP oxide layers.

In other applications, SiGe can be utilized. For example, a silicon layer can be formed over a SiGe layer. Due to the different lattice structures, the SiGe will impart a strain onto the silicon layer. This strained silicon layer can be utilized to fabricate faster transistors. FIGS. 1a-1c provide examples of conventional stress-inducing layers. In each case, an n-channel transistor 10 and a p-channel transistor 12 are formed in a silicon substrate 14. Due to differences in electron and hole mobility for n-channel or p-channel transistors respectively, it is desirable to cause a compressive stress in the p-channel transistor 12 and a tensile stress in the n-channel transistor 10.

FIGS. 1a and 1b provide an example that uses a single layer 16 that can induce a tensile stress. Since the tensile stress will adversely affect the p-channel transistors, the layer is etched away in the example of FIG. 1a. In the example of FIG. 1b, the layer is amorphized (e.g., with a germanium implant) to relax or dissolve the stress in the portions of the layer 16 overlying the p-channel transistor 12. These two embodiments have the disadvantage that only the n-channel transistor 10 is strained.

FIG. 1c shows an example of a structure that includes a dual layer. In this case, a tensile stress inducing layer 16 is formed over the n-channel transistor 10 and a compressive stress inducing layer 18 is formed over the p-channel transistor 12. As an example, U.S. Pat. No. 6,573,173 discloses an implementation where first and second nitride layers are formed over the PMOS and NMOS transistors using first and second plasma-enhanced chemical vapor deposition (PECVD) processes, respectively. The first deposition provides a tensile nitride film to impart a compressive stress in the channel region of the PMOS device, in turn, increasing the PMOS carrier mobility. The tensile film is removed from over the NMOS device, and the second deposition then provides a compressive nitride film over the NMOS transistor. This compressive film is removed from over the PMOS device, but remains over the NMOS so as to induce a tensile stress in the NMOS channel region.

Another method of inducing strain into the transistor utilizes a modified shallow trench isolation (STI) region. One method includes lining a STI recess with a stressor before filling the recess with a dielectric. The stressor can then impart a stress onto the adjacent semiconductor.

A problem with conventional stress-inducing structures and methods is integrating them with existing CMOS manufacturing methods. This stems from the fundamentally different requirements for enhancing PMOS versus NMOS performance. A tensile channel stress is most effective for NMOS devices, while a compressive channel stress is most effective for PMOS devices. These distinct requirements burden semiconductor manufacturing, particularly CMOS manufacturing, because NMOS and PMOS devices each demands separate methods, steps, or materials.

SUMMARY OF THE INVENTION

These and other problems are generally solved or circumvented, and technical advantages are generally achieved, by preferred embodiments of the present invention that provide structures and methods for improving charger carrier mobility in strained transistors.

A preferred embodiment of the invention provides a semiconductor device. A preferred device comprises an n-channel transistor and a p-channel transistor, disposed in a semiconductor body and a piezoelectric layer overlying the n-channel transistor and the p-channel transistor. In a preferred embodiment of the invention, the piezoelectric layer is biased to a first potential at a portion near the n-channel transistor and is biased to a second potential as a portion near the p-channel transistor.

An alternative embodiment of the invention comprises a MOS transistor formed in a substrate, an isolation trench formed adjacent the MOS transistor, and a piezoelectric liner formed in the isolation trench. Embodiments may further include a piezoelectric layer formed over the semiconductor. Suitable piezoelectric materials include, e.g., crystalline $SiO_2$ (quartz), lead zinc niobate, lead magnesium niobate, lead zirconate titanate, and combinations thereof. The substrate may comprise a bulk material such as silicon, germanium, silicon-germanium or GaAs. It may also comprise a modified SOI substrate, where dielectric layer of the SOI structure comprises a piezoelectric dielectric. In other applications, the device can include a piezoelectric gate dielectric or a piezoelectric channel.

Embodiments of the invention advantageously permit a first piezoelectric region and a second piezoelectric region to be independently biased to a first potential and a second potential. This in turn permits a PMOS transistor to receive a compressive channel stress and an NMOS transistor to receive a tensile channel stress without the need for separate stressor structures or materials. Since the piezoelectric effect is reversible, piezoelectric stressors offer the further advantage of reversibly modulating the stress level within the channel region. In certain embodiments, piezoelectric contacts may be coupled with source/drain or gate electrode contacts, thereby conserving power as well as valuable chip real estate.

Note that although the term layer is used throughout the specification and in the claims, the resulting features formed using the layer should not be interpreted together as only a continuous or uninterrupted feature. As will be clear from reading the specification, the semiconductor layer may be separated into distinct and isolated features (e.g., active regions), some or all of which comprise portions of the semiconductor layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a-2c are cross sectional views illustrating various embodiments of the invention that include a piezoelectric trench liner;

FIGS. 4a-4e are cross sectional views illustrating piezoelectric contact formation for various embodiments of the invention;

FIGS. 8a and 8b illustrate examples of contact formation for SOI embodiments of the present invention.

Figure 1A:
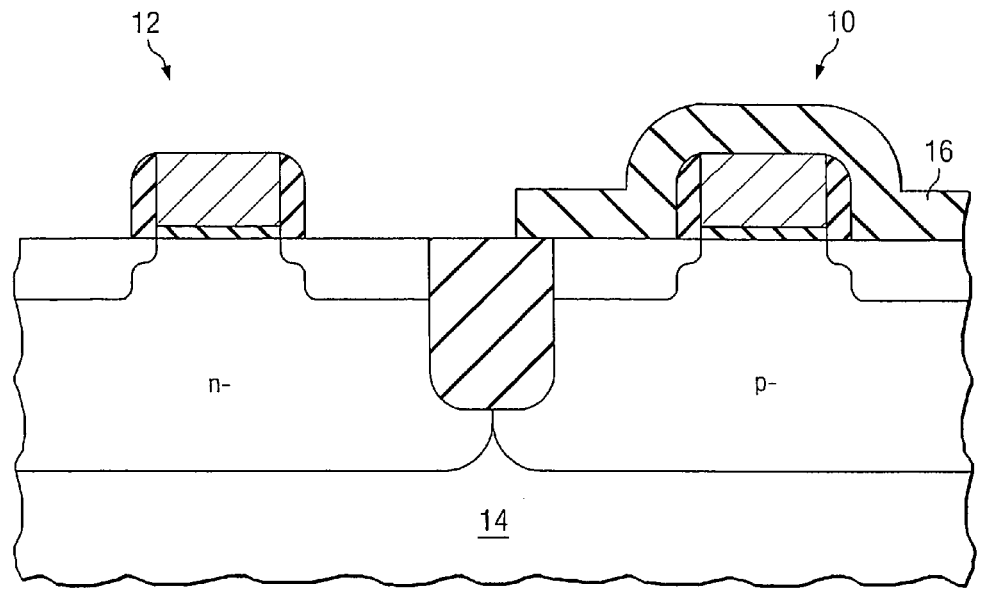
FIGS. 1a-1c are cross sectional views illustrating conventional stressor structures and methods in CMOS device.
Figure 1B:
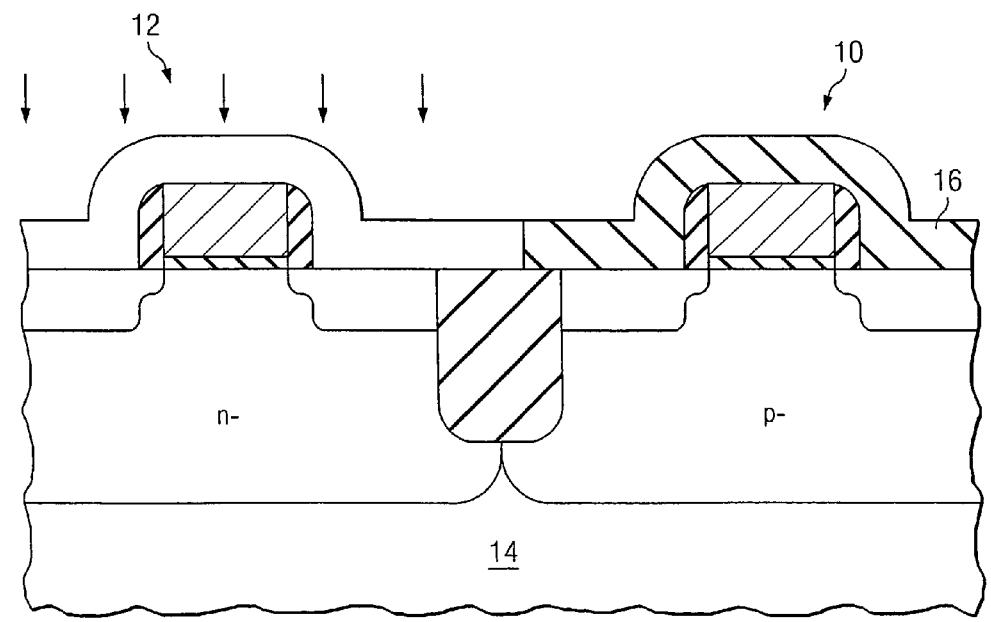
Figure 1C:
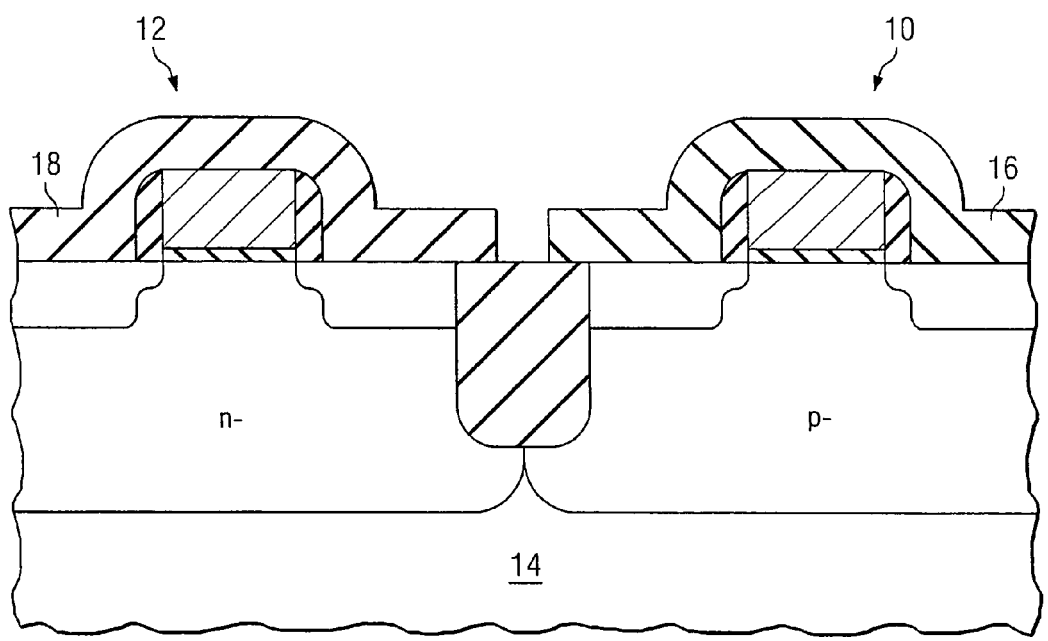

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for improving carrier mobility in a CMOS device. Preferred embodiments of the invention include a stressor, such as a layer, over NMOS and PMOS transistors in a CMOS device. In other preferred embodiments, the stressor comprises a liner formed within a recess of STI region. In preferred embodiments of the invention, the stressor comprises a piezoelectric material, or, more simply, a piezoelectric. In various embodiments of the invention, tensile or compressive forces are applied to the transistor channel region through appropriate biasing of the piezoelectric. Embodiments of the invention are particularly advantageous in CMOS manufacturing because a single piezoelectric may overly both types of devices. The appropriate stress for each type device is then readily obtained by applying the proper bias voltage to the respective type device.

Piezoelectric materials expand or contract when an electric field is applied to them. Piezoelectrics are commonly found in gas lighters, high frequency speakers, weighing devices, and micro-positioners. The piezoelectric effect occurs in materials having an asymmetric crystal structure. When an external force is applied, the charge centers of the crystal separate, thereby creating electric charges on the crystal surface. Conversely, electrically biasing the crystal causes reversible mechanical deformation, which typically varies linearly with applied electric field.

Piezoelectrics include both single crystals and ceramics. One common crystalline piezoelectric is quartz (crystalline $SiO_2$). Other crystalline piezoelectrics include lead zinc niobate (PZN) and lead magnesium niobate (PMN). Common ceramic piezoelectrics include lead zirconate titanate (PZT) and again PMN, which is available in both forms. Some of these materials can produce piezoelectric strains in excess of 1%.

The invention will now be described with respect to preferred embodiments in a specific context, namely a CMOS transistor. Embodiments of the present invention may also be applied, however, to other semiconductor device applications where one or more transistors are utilized. Embodiments of the present invention have useful application in single NMOS transistor or single PMOS transistor designs, for example. Note that the illustrative embodiments include only one PMOS device and one NMOS device. However, there typically many (e.g., thousands or millions) PMOS and NMOS devices formed on a semiconductor substrate during each of the manufacturing processes described herein.

Figure 2C:
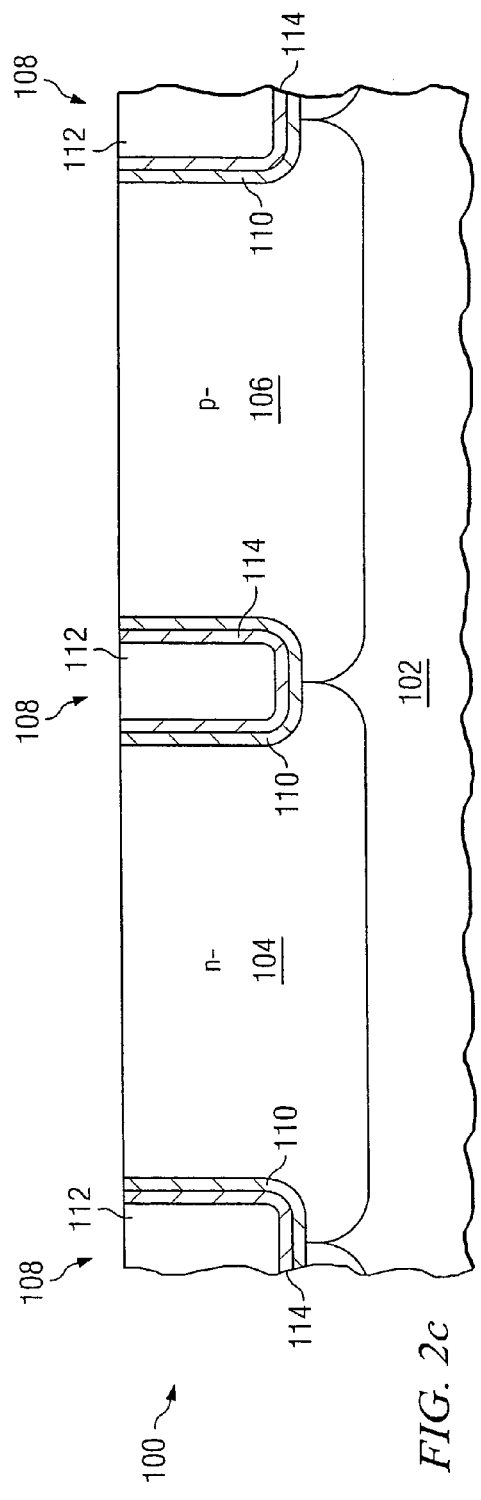

Turning now to FIG. 2, which includes three embodiments in FIGS. 2a, 2b and 2c, a semiconductor device 100 includes a substrate 102. The substrate 102 may comprise a semiconductor substrate comprising silicon or other semiconductor materials. The substrate 102 may comprise a single-crystal silicon substrate or a single-crystal silicon layer over another semiconductor (e.g., Si, SiGe, SiC) or an insulator (e.g., a silicon-on-insulator or SOI substrate). Compound or alloy semiconductors, such as GaAs, InP, Si/Ge, or SiC, as examples, can be used in place of silicon.

The substrate 102 includes a first active area 104 and a second active area 106. In the CMOS example that will be described, a p-channel transistor (PMOS) will be formed in the first active area 104 and an n-channel transistor (NMOS) will be formed in the second active area 106. As such, the first active area 104 is doped with n-type dopants and the second active area 106 is doped with p-type dopants. In other embodiments, other devices can be formed. For example, other NMOS transistors, other PMOS transistors, bipolar transistors, diodes, capacitors, resistors and other devices can be formed in active areas similar to 104 and 106.

As shown in FIG. 2, the first region 104 and the second region 106 are separated by a shallow trench isolation region 108 formed in the substrate 102. In the first embodiment, shown in FIG. 2a, the STI region includes a piezoelectric liner 110 that is conformally deposited within the trench of STI region 108. Other liners that are not illustrated can also be formed. In the preferred embodiment, the STI region 108 includes an oxide and/or a nitride liner (not shown) between the piezoelectric liner 110 and the trench sidewall. A barrier layer (not shown) between 110 and silicon active area may be necessary for some piezoelectric liners. The STI region 108 is filled with a trench filling material 112, such as silicon oxide or silicon (polysilicon or amorphous silicon).

FIG. 2b illustrates an alternative embodiment where the piezoelectric 110 substantially fills the STI 108 region. In this case, the fill material 112 can be eliminated.

In another embodiment, which is illustrated in FIG. 2c, a conductive liner 114 is formed within the STI trench adjacent the piezoelectric liner 110. In the illustrated embodiment, the piezoelectric liner 110 is formed first (i.e., closer to the trench walls). The order of formation can be reversed, or liners 114 can be formed on both sides of the piezoelectric 110. The conductive liner 114 is useful to bias the piezoelectric liner 110, which may be too thin to be biased throughout. The conductive liner can comprise, but is not limited to, polysilicon, TiN, TaSiN, Ir, IrO$_2$, Ru, or RuO$_2$.

To form the structures of FIG. 2, a masking layer (e.g., a nitride hard mask) can be formed over the surface of substrate 102 and patterned to expose the regions where the trench isolation will be formed. Trenches can then be etched, typically to a depth of between about 250 nm and about 500 nm. The trenches will typically surround active areas such as the active area 104 and 106 shown in FIG. 2. In other embodiments, deep trench isolation regions can be used.

According to the embodiments of FIGS. 2a and 2c, the piezoelectric liner 110 can now be deposited by PVD, CVD, MOCVD or ALD. The preferred CMOS piezoelectric liner can be one (or more) of ZnO, Bi$_{12}$GeO$_{20}$, BaTiO$_3$, PMN because their relative larger piezoelectric coefficient and well-known materials properties. As one example, the PMN and PZT system material have their typical piezoelectric coefficients of d33=180 to 220×10$^{-12}$ [m/V] respectively. The alternative candidate for piezoelectric liner 110 can be but is not limited: SiO$_2$, TeO$_2$, LiIO$_2$, the perovskite structure materials ferroelectric, such as BaTiO$_3$, LiNbO$_3$, LiTaO$_3$, Li (Nb,Ta)O$_3$, the tungsten-bronze-type structure, such as (Sr,Ba) Nb$_2$O$_6$, and others such as bismuth compounds Bi$_4$Ti$_3$O$_{12}$, Pb$_5$Ge$_3$O$_{11}$.

In another embodiment, the liner 110 may include an insulating layer, a conducting layer, a piezoelectric layer and a second conducting layer. The second conducting layer is preferably formed from one of the barrier materials listed above. The first conducting layer can be the same or a different material as the second conducting layer.

To prevent the inter-diffusion of piezoelectric to the source and drain area, it may be necessary to have a barrier liner adjacent to the piezoelectric liner. The candidate for this barrier can be SiN AlN, TiN, TaSiN. Among them, some barriers can be conductive, e.g. TiN, TaSiN, and therefore, may act as an electrode as well.

After the liner 110 (or liners 110 and others) are formed, the trench can be filled with material 112. The material 112 can comprise an oxide such as silicon dioxide. In one embodiment, the oxide is deposited using a high density plasma (HDP) process. In another embodiment, the oxide can be deposited by the decomposition of tetraethyloxysilane (TEOS). In other embodiments, other materials can be used to support high-aspect ratio fill for future generations. For example, the fill material 112 can be amorphous or polycrystalline (doped or undoped) silicon or a nitride such as silicon nitride.

In the embodiment of FIG. 2b, the fill material 112 is the same as the piezoelectric material 110. In this embodiment, the piezoelectric material can be ZnO, Bi12GeO20, BaTiO$_3$, PMN because their relative high piezoelectric coefficient and well-known materials properties. The alternative candidate for piezoelectric liner 110 can be, but not limited: SiO2, TeO$_2$, LiIO2, the perovskite structure materials ferroelectric, such as BaTiO3, LiNbO3, LiTaO3, Li (Nb,Ta)O3, the tungsten-bronze-type structure, such as (Sr,Ba)Nb2O6, and others such as bismuth compounds. These materials would be deposited by PVD, CVD, MOCVD, and ALD.

Figure 3:
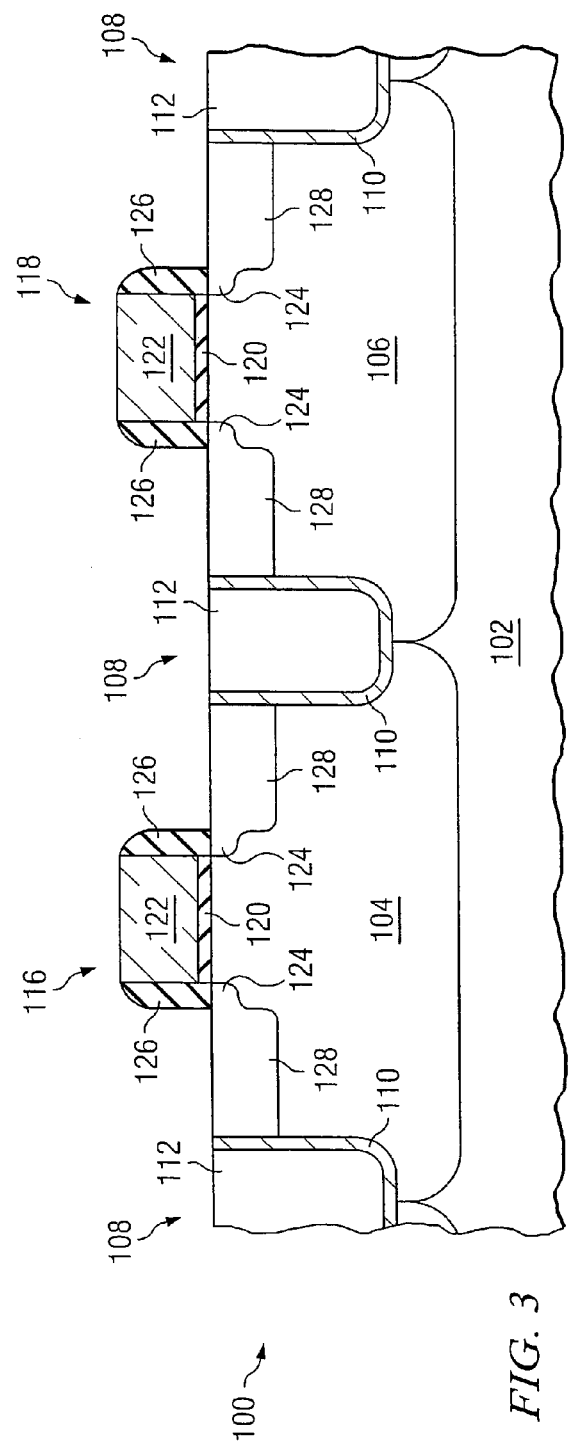
FIG. 3 is a cross sectional view illustrating the device of FIG. 2 after transistor formation.

Turning now to FIG. 3, there is shown the embodiment of FIG. 2a after formation of PMOS 116 and NMOS 118 transistors in the first and second active regions 104 and 106, respectively. A gate dielectric 120 is deposited over exposed portions of the semiconductor body 102. In one embodiment, the gate dielectric 120 comprises an oxide (e.g., SiO2), a nitride (e.g., Si3N4), or combination of oxide and nitride (e.g., SiN, oxide-nitride-oxide sequence). In other embodiments, a high-k dielectric material having a dielectric constant of about 5.0 or greater is used as the gate dielectric 120. Suitable high-k materials include HfO$_2$, HfSiO$_x$, Al$_2$O$_3$, ZrO$_2$, ZrSiO$_x$, Ta$_2$O$_5$, La$_2$O$_3$, nitrides thereof, Si$_x$N$_y$, SiON, HfAlO$_x$, HfAlO$_x$N$_{1-x-y}$, ZrAlO$_x$, ZrAlO$_x$N$_y$, SiAlO$_x$, SiAlO$_x$N$_{1-x-y}$, HfSiAlO$_x$, HfSiAlO$_x$N$_y$, ZrSiAlO$_x$, ZrSiAlO$_x$N$_y$, combinations thereof, or combinations thereof with SiO$_2$, as examples. Alternatively, the gate dielectric 120 may comprise other high k insulating materials or other dielectric materials. The gate dielectric 120 may comprise a single layer of material, or alternatively, the gate dielectric 120 may comprise two or more layers.

The gate dielectric 120 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 120 may be deposited using other suitable deposition techniques. The gate dielectric 120 preferably comprises a thickness of about 10 Å to about 60 Å in one embodiment, although alternatively, the gate dielectric 120 may comprise other dimensions.

In the illustrated embodiment, the same dielectric layer is used to form the gate dielectric 120 for both the p-channel transistor 116 and the n-channel transistor 118. This feature is not required, however. In an alternate embodiment, the p-channel transistor 116 and the n-channel transistor 118 each have different gate dielectrics.

A gate electrode 122 is formed over the gate dielectric 120. The gate electrode 122 preferably comprises a semiconductor material, such as polysilicon or amorphous silicon, although alternatively, other semiconductor materials may be used for the gate electrode 122. In other embodiments, the gate electrode 122 may comprise polysilicon, TiN, HfN, TaN, W, Al, Ru, RuTa, TaSiN, NiSi$_x$, CoSi$_x$, TiSi$_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 122 comprises a doped polysilicon layer underlying a silicide layer (e.g., titanium silicide, nickel silicide, tantalum silicide, cobalt silicide, platinum silicide).

If the gate electrode 122 comprises FUSI, for example, polysilicon may be deposited over the gate dielectric 120, and a metal such as nickel may be deposited over the polysilicon. Other metals may alternatively be used. The substrate 102 may then be heated to about 600 or 700° C. to form a single layer of nickel silicide. The gate electrode 143 may comprise a plurality of stacked gate materials, such as a metal underlayer with a polysilicon cap layer disposed over the metal underlayer. A gate electrode 122 between about 500 to 2000 Å thick may be deposited using CVD, PVD, ALD, or other deposition techniques.

The p-channel transistor 116 and the n-channel transistor 118 preferably include gate electrodes 122 formed from the same layers. If the gate electrodes include a semiconductor, the semiconductor can be doped differently for the p-channel transistor 116 and the n-channel transistor 118. In other embodiments, the different types of transistors can include gates of different materials.

The gate layer (and optionally the gate dielectric layer) are patterned and etched using known photolithography techniques to create the gate electrodes 122 of the proper pattern. After formation of the gate electrodes, lightly doped source/drain regions 124 can be implanted using the gate electrode 122 as a mask. Other implants (e.g., pocket implants, halo implants or double diffused regions) can also be performed as desired.

Spacers 126 comprising an insulating material such as an oxide and/or a nitride may be formed on the sidewalls of the gate electrode 122. The spacers 126 are typically formed by the deposition of a conformal layer followed by an anisotropic etch. The process can be repeated for multiple layers, as desired.

Source/drain regions 128 can be formed in exposed surfaces of the n-well 104 and p-well 106. Preferably, ions (e.g., boron for the PMOS transistor 116 and arsenic and/or phosphorus for the NMOS transistor 118) are implanted, according to conventional methods.

While not shown, it is understood that an interlayer dielectric (ILD) layer will be formed over the transistors 116 and 118. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethoxysilane (TEOS), as examples. Typically, gate electrode and source/drain contacts (not shown) are formed through the interlayer dielectric. Metallization layers that interconnect the various components are also included in the chip, but not illustrated for the purpose of simplicity.

To summarize, FIG. 3 illustrates a CMOS device 100 wherein an STI region 108 is lined with a stressor that is preferably a piezoelectric material 108. An advantage of embodiments of the invention is that the same stressor material and structure may be formed simultaneously for both PMOS 116 and NMOS 118 devices. The liners adjacent the PMOS and NMOS transistor can, however, be biased differently to tailor the stress for any given layer.

The piezoelectric stress liner including a piezoelectric film, or a piezoelectric material filled STI trench, can be biased in various ways based on the film crystal direction to utilize its higher piezoelectric coefficient. The most preferred bias directions can be along (parallel) or perpendicular to the polar axis of the piezoelectric materials. For the STI liner type, the bias can be parallel to the piezoelectric file direction.

FIGS. 4a and 4b illustrate two examples of how the piezoelectric liner 110 could be biased. In FIG. 4a, the piezoelectric liner is biased from an upper surface (e.g., with a contact made anywhere adjacent the liner, preferably close to the channel). In the illustrated example, the piezoelectric liner 110 and/or conductive liner 114 are extended over the upper surface of the doped region 128. In the embodiment of FIG. 4b, the piezoelectric liner 110 and/or conductive liner 114 are extended over the STI region 108 (e.g., by deposition of an additional layer of layers). The portions of the liner 110 adjacent to a PMOS transistor 116 can be biased with a first voltage $V_1$, while the portions of the liner 110 adjacent to an NMOS transistor 118 can be biased with a second voltage $V_2$.

The voltages $V_1$ and $V_2$ can be fixed voltages (i.e., at a relatively constant level while power is being applied to the chip). Preferably, the voltages $V_1$ and $V_2$ are signals that only reach the preferred level while the adjacent transistor is conducting. For example, it is desirable that the NMOS transistor be adjacent to a liner 110 that creates a tensile channel stress when a positive voltage is provided. If so, the voltage $V_1$ can be coupled to the gate voltage of the transistor. In this case, electrical contact could be made by having the gate electrode 122 contact (physically and/or electrically) the piezoelectric liner 110 and or the conductive liner 114, which liners may or may not extend over the fill material 112.

Similarly, it is desirable that the PMOS transistor 116 be adjacent to a liner 110 that creates a compressive channel stress when a low voltage is provided so that the voltage $V_2$ can be coupled to the gate voltage of the transistor 116. In the case of a CMOS inverter, which includes a NMOS and a PMOS transistor with a commonly coupled gate, the common gate signal can be applied to the STI to effectively stress the "on" transistor to increase carrier mobility and stress the "off" transistor to decrease carrier mobility.

In the preferred embodiment, one of the voltages $V_1$ (or $V_2$) can be between about 0.8 and 1.8 volts while the other of the voltages $V_2$ (or $V_1$) can be about 0 volts. In one embodiment, the voltages $V_1$ and $V_2$ are supplied independently of the circuits that operate the transistors 116 and 118. In this case, the piezoelectric liner 110 can be biased to a midpoint voltage (e.g., halfway between $V_1$ and $V_2$) when the transistor is not being operated.

In other embodiments, the piezoelectric liner 110 is biased only in regions adjacent to either one of the n-channel 118 or p-channel 116 transistors. For example, the piezoelectric liner 110 can be deposited so that in the unbiased state it causes a stress (either compressive or tensile). Portions of the liner could then be biased to lessen (i.e., make less compressive or tensile), remove (i.e., make unstressed) or reverse (i.e., turn compressive to tensile or tensile to compressive) the natural stress. Alternatively, the piezoelectric liner could be deposited in a relaxed state and portions biased to stress either the n-channel or the p-channel transistors, but not both.

Figure 4C:
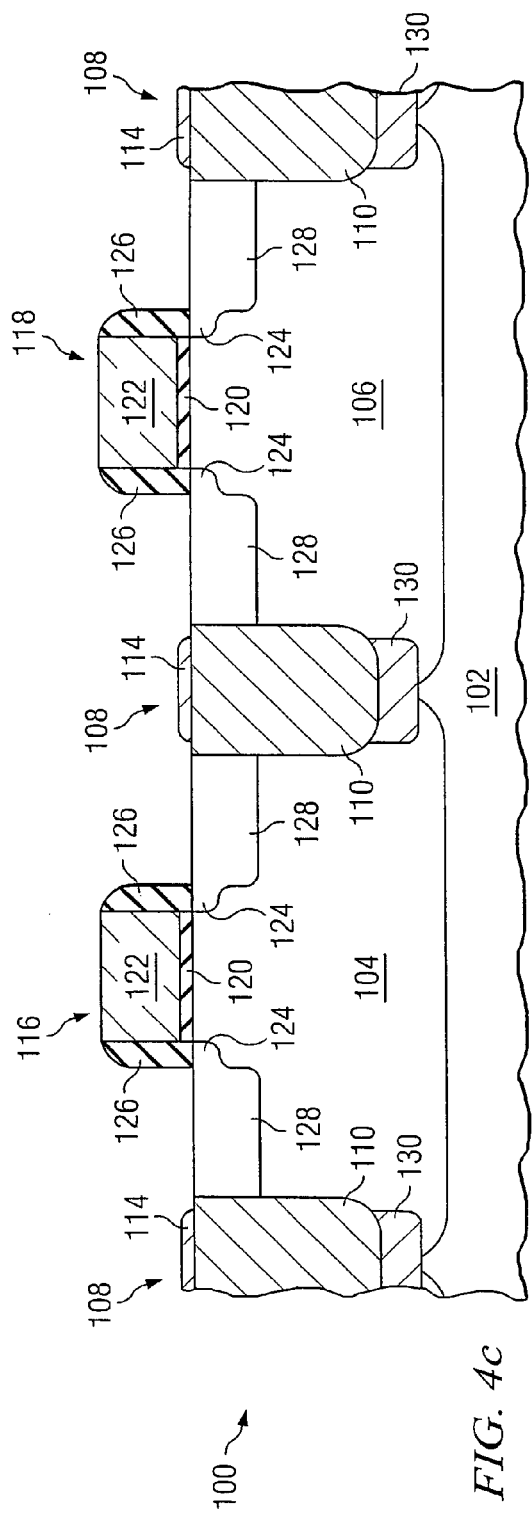
Figure 4D:
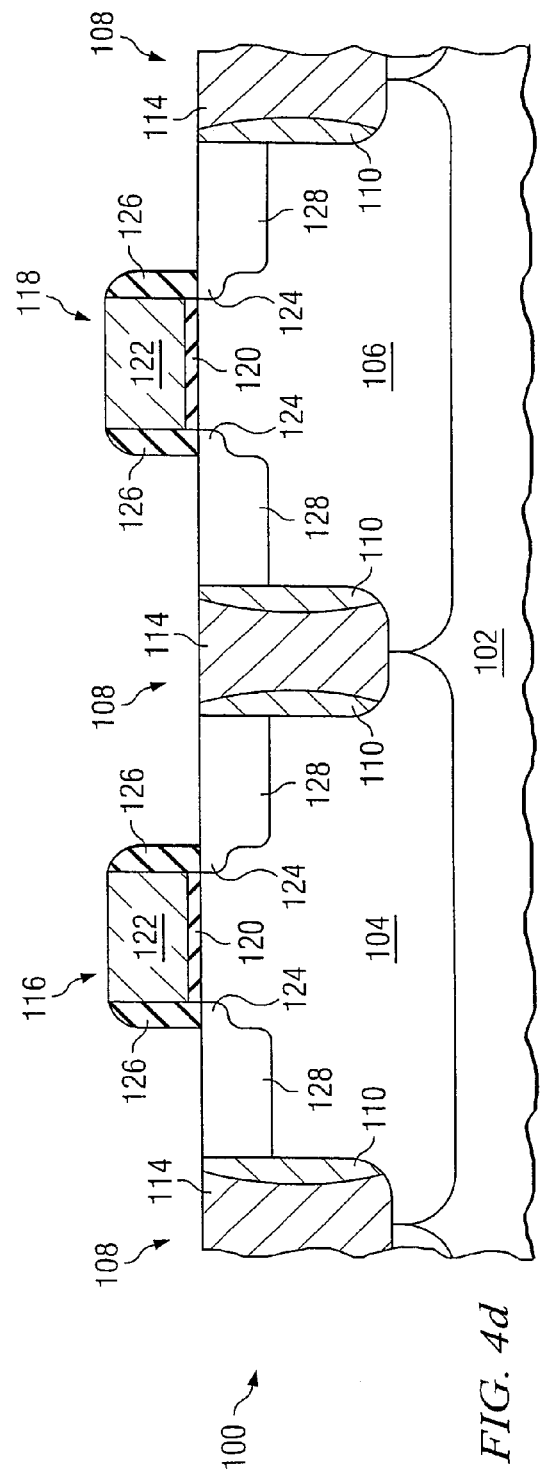

FIG. 4c illustrates an alternate embodiment wherein the piezoelectric liner 110 is biased from beneath the trench. In this embodiment, a buried conductor 130 electrically contacts piezoelectric liner 110 and carries the desired bias voltage $V_1$ or $V_2$. For example, the buried conductor can be a highly doped region that is implanted after the trench is formed but before the trench is filled. In the embodiment of FIG. 4d, the piezoelectric is biased from the sidewalls of the trench isolation.

In an alternate embodiment, the trench fill material 112 can comprise a conductor (e.g., doped amorphous or polysilicon). The trench fill material 112 could then be biased as desired. In this embodiment, either biasing from above, as shown in FIG. 4a, from below, as shown in FIG. 4b, or otherwise could be used.

Figure 4E:
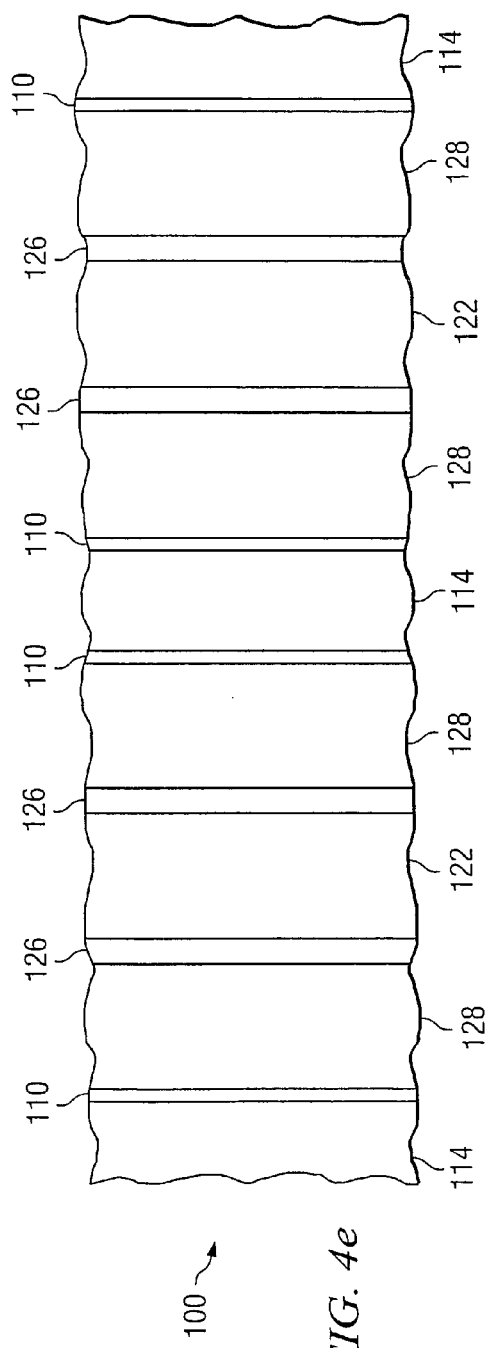

For the STI fill type, the preferred bias direction is perpendicular to the direction of the channel which the stress would like to be applied. The electrode can be formed either on the top or bottom part of STI as shown in FIG. 4c. In another embodiment, the electrode can be formed on the two STI side walls that are perpendicular to the stressed transistor channel direction as shown in FIGS. 4d and 4e.

A second embodiment of the invention will now be described with respect to FIG. 5. In this embodiment, a piezoelectric layer 140 is formed over the transistors 116 and 118. As described above, conventional stressor methods include depositing a tensile film, such as silicon nitride, over the device 100. Such a film is known by those skilled in the art as an effective means for creating a tensile channels stress, which is particularly favorable for enhancing NMOS performance. Since such a film, however, is known to degrade PMOS performance, a tensile film over PMOS devices may undergo further treatment, such as a germanium implant, to make the film less tensile. The embodiment illustrated in FIG. 5, however, advantageously allows for a single stress-inducing layer to be formed over all transistors and then biased to create the appropriate stress.

Figure 5:
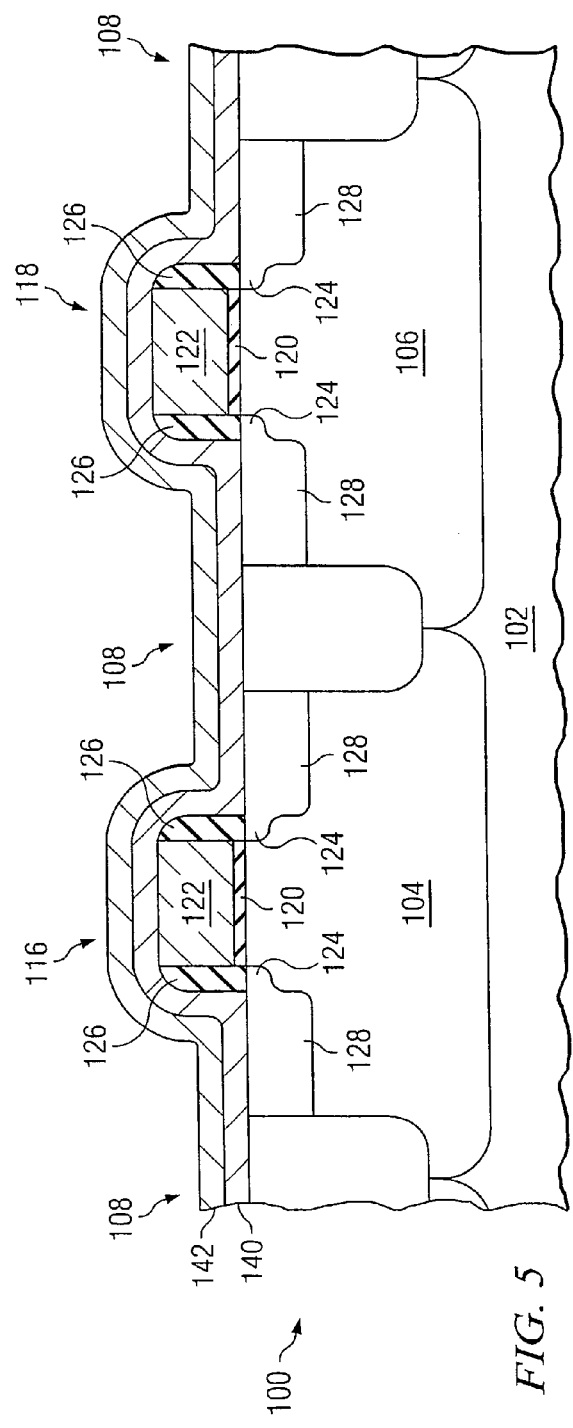
FIG. 5 is a cross sectional view illustrating an embodiment of the invention wherein a piezoelectric layer is formed over a transistor device.

The embodiment of FIG. 5 may be formed from the structure illustrated in FIG. 3. As shown in FIG. 5, device 100 preferably includes a piezoelectric layer 140 over PMOS transistor 116 and NMOS transistor 118 devices. A conductive layer 142 is optionally included over the piezoelectric layer 140. In the illustrated embodiment, the layers 140 and 142 are not patterned. In an alternate embodiment, one or both of the layers 140 and 142 can be patterned to electrically isolate the portions overlying the PMOS transistor 116 from portions overlying the NMOS transistor 118.

The STI regions 108 can include piezoelectric liners, as described above, or can be other (e.g., conventional) isolation regions. In one embodiment, the n-channel transistors 118 (or p-channel transistors 116) are stressed by a liner in the STI region 108 while the p-channel transistors 116 (or n-channel transistors 118) are stressed by a layer 140 above the transistor 116 (118). In another embodiment, the piezoelectric STI liner 108 and piezoelectric layer 140 may operate cooperatively to induce strain in the transistor channel regions. Through appropriate biasing, the respective layers may act together to increase or decrease channel strain.

After formation of the transistors 116 and 118 (e.g., as described above), the piezoelectric layer 140 can be deposited. The preferred material can be ZnO, $Bi_{12}GeO_{20}$, BaTiO3, PMN. As an example, (Ba, Sr)TiO ½ can be deposited by MOCVD single wafer reactor with liquid delivery precursor. The organic sources reagents can be used with a oxidizing gases of $O_2$ and $N_2O$. Both the crystallized or amorphous file can be obtained depends on the deposition temperature. The film can be As-deposited polarized or be polarized in the later stage when both electrodes of the piezoelectric liner are formed. The alternative process can be PVD which will require a lower aspect ratio of the STI but has the advantage of lower film deposition temperature. The film thickness can be between about 50 nm and about 300 nm.

The optional conductive layer 142 can be deposited over the piezoelectric layer 140. The conductive layer 142 is typically used when the resistivity of the piezoelectric layer 140 is too high to bias the transistors with a desired number of contacts. In the preferred embodiment, the conductive liner 142 is Pt with thickness of about 10 nm to about 50 nm deposited by PVD or CVD. The typical sheet resistivity is about 10-50 micro ohm.cm. The alternative electrode layer can be TaN, TiN. As an example, the Pt can be deposited by a PVD with deposition temperature at 200° C. to 500° C.

In one embodiment, the conductive layer 142 (and/or piezoelectric layer 140) is patterned to electrically isolate the portions overlying the PMOS transistor 116 from portions overlying the NMOS transistor 118. If this occurs, the conductive layer 142 can be provided with a very low sheet resistance without consuming excessive power. In an alternate embodiment, the conductive layer 142 (and/or piezoelectric layer 140) can be left unpatterned. In this case, the portions overlying the PMOS and NMOS transistors 116 and 118 can be biased independently. In this embodiment, the sheet resistance of the layers 140 and 142 are preferably kept low so that only a minimal current will flow through the conductor.

As discussed above, the piezoelectric layer is preferably biased to create a compressive channel stress over the PMOS transistor 116 and a tensile channel stress over the NMOS transistor 118. This can be done by additional contacts—however, this is not preferred due to additional required area. It is preferred to use already existing contacts/biases to connect the piezoelectric layers. In one example, the gate voltages can be applied to appropriate portions of the piezoelectric liner when applied to the gate electrode 122. This configuration simplifies the bias circuitry and contacts. In one embodiment, the gate contact (not shown) can be implemented as a butted contact that also electrically connects to the piezoelectric layer 140.

In an alternate embodiment, the piezoelectric can be biased via the source contact. This feature enables biasing only for the case when the transistor is electrically active. In another embodiment, an STI can be combined with a CESL (contact etch stop layer). For example, these could be connected by additional contacts within the isolation area (in analogy to substrate contacts just connecting the piezoelectric liner/STI fill.

As with the STI liner embodiment, the piezoelectric layer 140 can be biased only in regions adjacent to either one of the p-channel transistor 116 or n-channel 118 transistor. For example, the piezoelectric layer 140 can be deposited so that in the unbiased state it causes a stress (either compressive or tensile). Portions of the layer 140 could then be biased to lessen (i.e., make less compressive or tensile), remove (i.e., make unstressed) or reverse (i.e., turn compressive to tensile or tensile to compressive) the natural stress. Alternatively, the piezoelectric layer 140 could be deposited in a relaxed state and portions biased to stress either the n-channel or the p-channel transistors, but not both.

Figure 6:
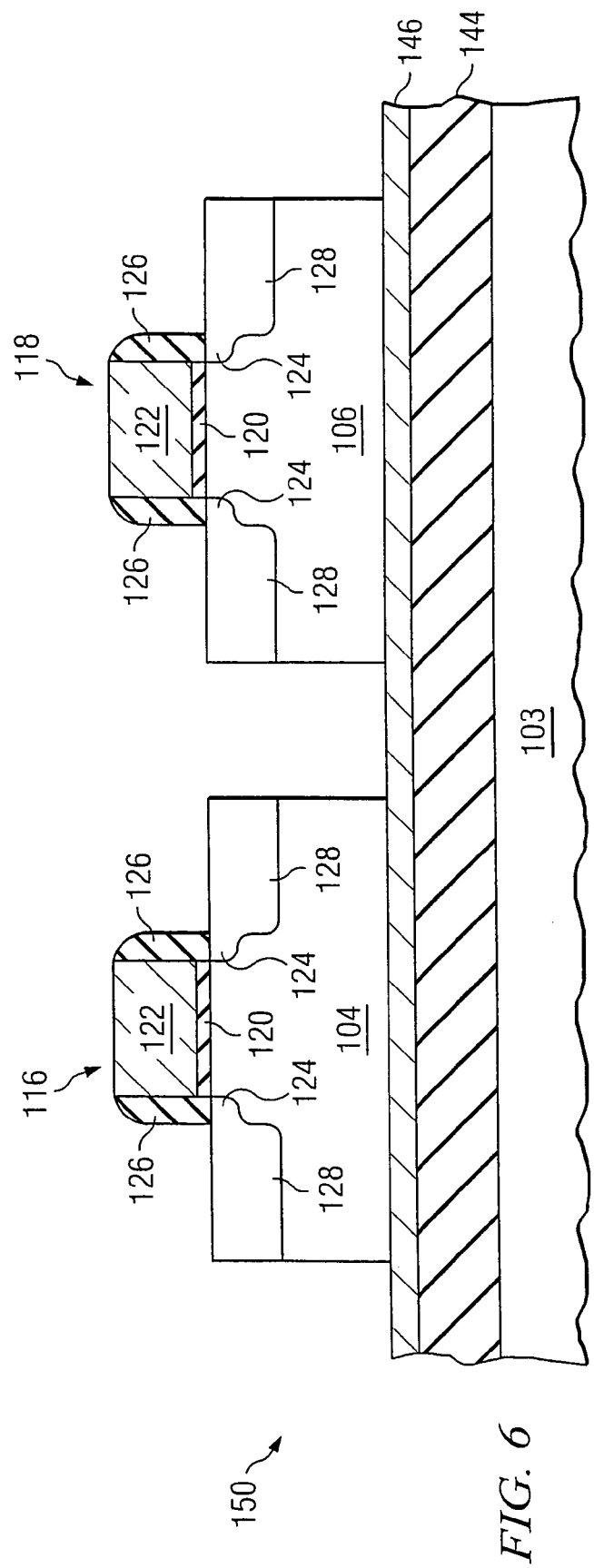
FIG. 6 is a cross sectional view of an SOI substrate that includes a piezoelectric dielectric according to embodiments of the invention.

FIG. 6 illustrates another embodiment that can be used with an SOI substrate. This embodiment can be combined with one or both of the embodiments (or variations of the embodiments) described with respect to FIGS. 3 and 5. Alternatively, the previously described embodiments can be implemented using an SOI substrate.

The SOI embodiment includes a substrate 103, a dielectric layer 144 (e.g., a buried oxide layer), and an overlying silicon layer 150. The active areas 104 and 106 are formed in regions of the silicon layer 150. The embodiment of FIG. 6 further includes a piezoelectric layer 146 over the dielectric layer 144. Alternatively, the dielectric layer 144 can be formed from a piezoelectric material (e.g., quartz), in which case an additional layer 146 would not be needed. In an embodiment of the invention, the dielectric layer 144 may comprise amorphous silicon oxide, and the piezoelectric dielectric 146 may comprise an oriented quartz crystal, for example. The SOI substrate can optionally include buffer layers (not illustrated) to control threading dislocations caused by lattice mismatch. The piezoelectric dielectric 146 may be suitably biased to enhance carrier mobility in the plurality of devices.

Figure 7A:
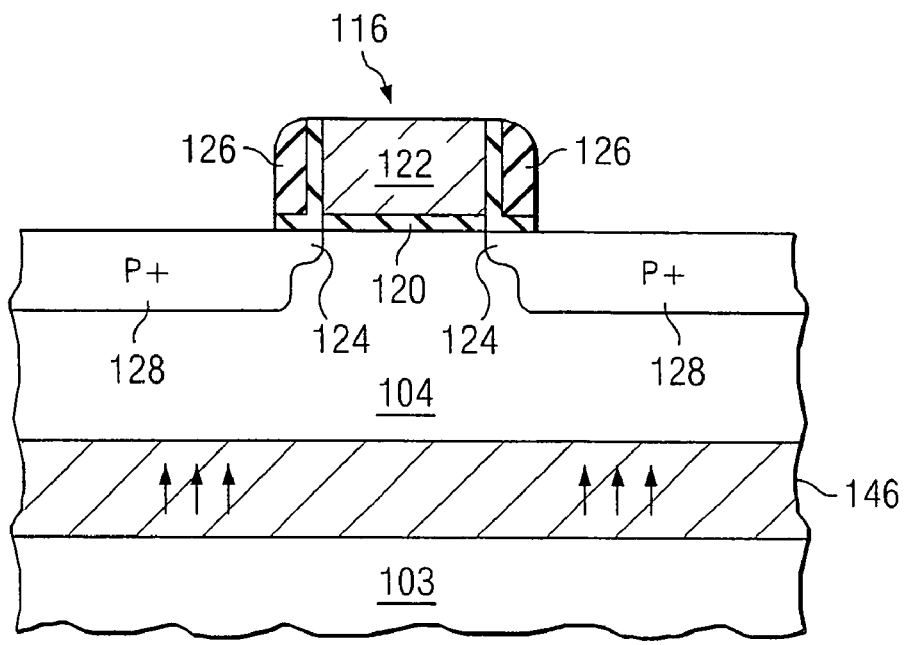
FIG. 7a is a cross-section view illustrating the stress formed for a p-channel SOI transistor.
Figure 7B:
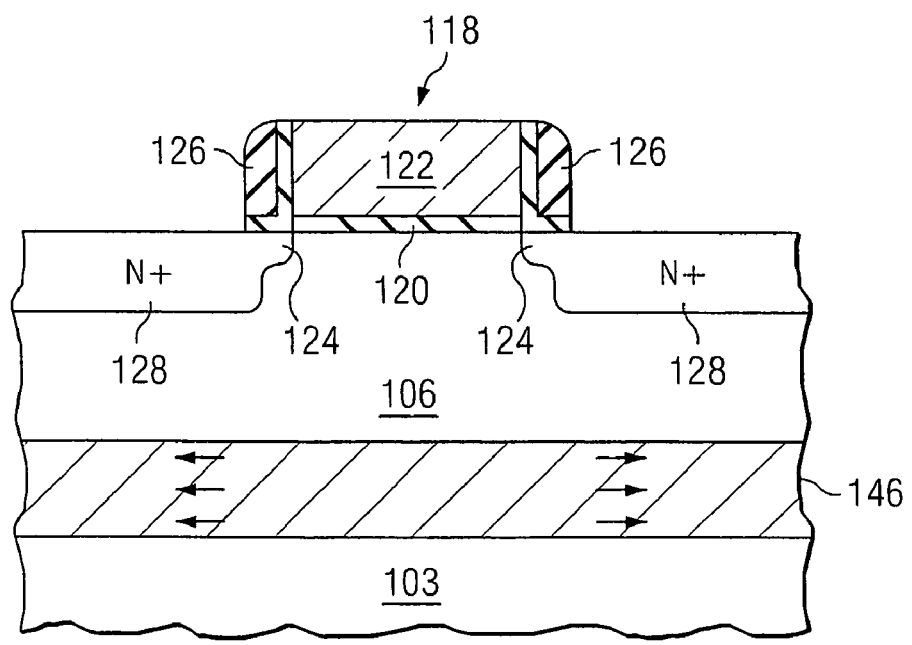
FIG. 7b is a cross-section view illustrating the stress formed for an n-channel SOI transistor.

FIGS. 7a and 7b illustrate schematically how the embedded stress can advantageously effect the carrier mobility for a p-channel FET (FIG. 7a) and an n-channel FET (FIG. 7b). Referring first to FIG. 7a, a piezoelectric material 146 is biased beneath the source and drain regions 128 of p-channel transistor 116 to create a compressive stress in the channel. In FIG. 7b, the piezoelectric material 146 is biased beneath the channel of n-channel transistor 118 to create a tensile stress in the channel.

FIG. 8a illustrates an embodiment wherein conductors 150 are included between the piezoelectric material 146 and dielectric 144. As illustrated, these conductors can be patterned to bias the desired portions of the piezoelectric layer 146. Contact connections 154 can be made through dielectric regions 152, which is provided to isolate the various semiconductor islands. For example, the conductors can be Pt, Ir, W, Co, or TiN, TaN and may be a optional barrier layer between conductors and piezoelectric.

In another embodiment, shown in FIG. 8b, the piezoelectric material 146 is biased by including conductors 150 in the substrate 103 beneath the piezoelectric material 146. This embodiment is especially beneficial when the buried insulator is a piezoelectric (e.g., quartz) of a thickness conducive to backside biasing. In the illustrated example, the conductors 150 are patterned to lie beneath the portions of the piezoelectric material 146 that will be biased. Once again, a contact connection 154 is made through regions 152 and 146 to provide the appropriate voltages. If the substrate 103 is a semiconductor (e.g., silicon), the conductors 150 can be doped regions. Alternatively, the conductors can be a metal such as Pt, Ir, W, Co, or TiN, TaN and may be a optional barrier layer between conductors and piezoelectric.

In an alternative embodiment, not shown, a conductor can be included between the semiconductor layer 150 and the piezoelectric material 146. In yet another embodiment, the piezoelectric material can be accessed by conductors from the back side of the substrate 103. Contact holes can be etched through the substrate and accessed via a backside contact.

As with the previously described embodiments, the piezoelectric material 146 is preferred to be biased only in regions adjacent to either one of the n-channel 118 or p-channel 116 transistors. For example, the piezoelectric liner 110 can be deposited so that in the unbiased state it causes a stress (either compressive or tensile) or can be deposited in a relaxed state and operated in a manner that only one conductivity type of transistor receives stress.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A semiconductor device comprising:
    an n-channel transistor disposed in a semiconductor body;
    a p-channel transistor disposed in the semiconductor body; and
    a piezoelectric layer adjacent the n-channel transistor and the p-channel transistor, wherein the piezoelectric layer comprises $Bi_{12}GeO_{20}$.

2. A semiconductor device comprising:
    an n-channel transistor disposed in a semiconductor body;
    a p-channel transistor disposed in the semiconductor body; and
    a piezoelectric layer adjacent the n-channel transistor and the p-channel transistor, wherein the piezoelectric layer is biased to a first potential at a portion near at least one of the n-channel transistor or the p-channel transistor.

3. The device of claim 2, wherein the piezoelectric layer is biased to the first potential at the portion near the n-channel transistor and is biased to a second potential at a portion near the p-channel transistor.

4. A semiconductor device comprising:
    an n-channel transistor disposed in a semiconductor body;
    a p-channel transistor disposed in the semiconductor body; and
    a piezoelectric layer adjacent the n-channel transistor and the p-channel transistor, wherein the piezo electric layer comprises ZnO.

5. A semiconductor device comprising:
    an n-channel transistor disposed hi a semiconductor body;
    a p-channel transistor disposed in the semiconductor body; and
    a piezoelectric layer adjacent the n-channel transistor and the p-channel transistor, wherein the piezo electric layer overlies the n-channel transistor and the p-channel transistor.

6. The device of claim 5, further comprising a conductive layer overlying the n-channel transistor and the p-channel transistor, the conductive layer operable to be biased to create a stress in selected portions of the piezoelectric layer.

7. The device of claim 6, wherein a portion of the piezoelectric layer overlying the n-channel transistor is electrically isolated from a portion of the piezoelectric layer overlying the p-channel transistor.

8. The device of claim 2, wherein the piezoelectric layer is disposed within an isolation trench.

9. The device of claim 8, further comprising a conductive layer disposed within the isolation trench adjacent the piezoelectric layer.

10. The device of claim 5, wherein the semiconductor body comprises a semiconductor layer that overlies an insulating layer, the insulating layer overlying a substrate.

11. A semiconductor device comprising:
    a semiconductor body comprising a semiconductor layer that overlies an insulating layer, the insulating layer overlying a sub strate;
    an n-channel transistor disposed in the semiconductor body;
    a p-channel transistor disposed in the semiconductor body; and
    a piezoelectric layer adjacent the n-channel transistor and the p-channel transistor, wherein the piezoelectric layer underlies the semiconductor layer.

12. The device of claim 11, wherein the insulating layer is the piezo electric layer.

13. A semiconductor device comprising:
    a semiconductor body comprising a semiconductor layer that overlies an insulating layer;
    an n-channel transistor disposed in the semiconductor body;
    a p-channel transistor disposed in the semiconductor body; and
    a piezoelectric layer adjacent the n-channel transistor and the p-channel transistor, wherein the piezoelectric layer underlies the semiconductor layer and wherein the piezoelectric layer is disposed between the semiconductor layer and the insulating layer.

14. A semiconductor device comprising:
    a MOS transistor formed in a substrate;

an isolation trench formed adjacent the MOS transistor; and a piezoelectric liner formed in the isolation trench.

15. The device of claim 14, further comprising a piezoelectric layer formed over the MOS transistor.

16. The device of claim 15, wherein the piezoelectric layer and the piezoelectric liner are independently biased to one of a first potential or a second potential.

17. The device of claim 14, wherein a piezoelectric liner comprises a material selected from the group consisting essentially of ZnO, $Bi_{12}GeO_{20}$, $BaTiO_3$, PMN and combinations thereof.

18. The device of claim 14, wherein the MOS transistor comprises a p-channel transistor and wherein the piezoelectric liner can be biased to create a compressive strain in a channel region of the p-channel transistor.

19. The device of claim 14, wherein the MOS transistor comprises an n-channel transistor and wherein the piezoelectric liner can be biased to create a tensile strain in a channel region of the n-channel transistor.

20. A method of fabricating a semiconductor device, the method comprising:
forming a transistor at a surface of a semiconductor body;
forming a piezo electric layer over the transistor; and
electrically coupling at least a portion of the piezoelectric layer to a voltage node carrying a voltage of about 0.8 to 1.8 V.

21. The method of claim 20, wherein the voltage node carries a signal that causes the piezoelectric layer to cause a stress in the transistor when the transistor is turned on.

22. A method of fabricating a semiconductor device, the method comprising:
forming a transistor at a surface of a semiconductor body;
forming a piezoelectric layer in an isolation trench alongside the transistor; and
electrically coupling at least a portion of the piezoelectric layer to a voltage node.

23. A method of fabricating a semiconductor device, the method comprising:
providing a semiconductor body comprising a semiconductor layer that overlies an insulating layer, a piezoelectric layer underlying the semiconductor layer and between the semiconductor layer and the insulating layer;
forming a transistor at a surface of the semiconductor body, wherein the transistor is formed over the piezoelectric layer; and
electrically coupling at least a portion of the piezoelectric layer to a voltage node.

24. A method of operating a transistor device, the method comprising:
turning on a transistor of a first conductivity type;
while the transistor of the first conductivity type is on, applying a voltage to a layer adjacent the transistor to cause a stress in the transistor, wherein applying the voltage comprises applying a voltage of about 0.8 to 1.8 V;
turning off the transistor of the first conductivity type; and
while the transistor of the first conductivity type is off, removing the voltage from the layer adjacent the transistor thereby no longer causing the stress in the transistor.

25. The method of claim 24, wherein applying the voltage to the layer adjacent the transistor comprises applying the voltage to a piezoelectric layer.

26. The device of claim 5, wherein the piezoelectric layer is biased to a first potential at a portion near at least one of the n-channel transistor or the p-channel transistor.

27. The device of claim 26, wherein the piezoelectric layer is biased to the first potential at the portion near the at least one n-channel transistor and is biased to a second potential at a portion near the p-channel transistor.

28. The device of claim 11, wherein the piezoelectric layer is biased to a first potential at a portion near at least one of the n-channel transistor or the p-channel transistor.

29. The device of claim 28, wherein the piezoelectric layer is biased to the first potential at the portion near the at least one n-channel transistor and is biased to a second potential at a portion near the p-channel transistor.

30. A method of operating a transistor device that includes a first transistor and a second transistor, the method comprising:
turning on the first transistor;
while the first transistor is on but the second transistor is off, applying a voltage to a layer over the first transistor to cause a first stress in the first transistor but not in the second transistor;
turning off the first transistor; and
while the first transistor is off, removing the voltage from the layer over the first transistor thereby no longer causing the first stress in the first transistor.

31. The method of claim 30, wherein applying the voltage to the layer over the first transistor comprises applying the voltage to a piezoelectric layer.

32. The method of claim 31, wherein applying the voltage comprises applying a voltage of about 0.8 to 1.8 V.

33. The method of claim 30, wherein the first transistor comprises a transistor of a first conductivity type and the second transistor comprises a transistor of a second conductivity type different than the first conductivity type.

34. The method of claim 30, further comprising:
turning on the second transistor;
while the second transistor is on but the first transistor is off, applying a second voltage to a layer over the second transistor to cause a second stress in the second transistor but not in the first transistor;
turning off the second transistor; and
while the second transistor is off, removing the second voltage from the layer over the second transistor thereby no longer causing the first stress in the second transistor.

35. The method of claim 34, wherein the second voltage is different than the first voltage.

36. The method of claim 35, wherein the first transistor comprises an NMOS transistor arid the first stress comprises a tensile stress and wherein the second transistor comprises a PMOS transistor and the second stress comprises a compressive stress.

* * * * *

UNITED STATES PATENT AND TRADEMARK OFFICE
CERTIFICATE OF CORRECTION

PATENT NO. : 7,586,158 B2  Page 1 of 1
APPLICATION NO. : 11/176727
DATED : September 8, 2009
INVENTOR(S) : Hierlemann et al.

It is certified that error appears in the above-identified patent and that said Letters Patent is hereby corrected as shown below:

In Col. 12, line 14, delete "piezo electric" and insert --piezoelectric--.
In Col. 12, line 17, delete "hi" and insert --in--.
In Col. 12, line 21, delete "piezo electric" and insert --piezoelectric--.
In Col. 12, line 43, delete "sub strate" and insert --substrate--.
In Col. 12, line 53, delete "piezo electric" and insert --piezoelectric--.
In Col. 13, line 25, delete "piezo electric" and insert --piezoelectric--.
In Col. 14, line 56, delete "arid" and insert --and--.

Signed and Sealed this

Seventeenth Day of November, 2009

David J. Kappos
*Director of the United States Patent and Trademark Office*